United States Patent [19]
Lee

[11] Patent Number: 5,981,355
[45] Date of Patent: Nov. 9, 1999

[54] METHOD OF FORMING ISOLATING REGION

[75] Inventor: Seung Ho Lee, Chungcheongbuk-do, Rep. of Korea

[73] Assignee: LG Semicon Co., Ltd., Chungcheongbuk-do, Rep. of Korea

[21] Appl. No.: 08/889,067

[22] Filed: Jul. 7, 1997

[30] Foreign Application Priority Data

Nov. 7, 1996 [KR] Rep. of Korea ................. 96-52558

[51] Int. Cl.⁶ .................................................. H01L 21/762
[52] U.S. Cl. ...................... 438/424; 438/427; 438/951; 438/704; 438/732
[58] Field of Search ................... 438/427, 951, 438/704, 732, 734, FOR 127, FOR 227, FOR 455, 424; 148/DIG. 85, DIG. 86, DIG. 50

[56] References Cited

U.S. PATENT DOCUMENTS 4,551,911  11/1985  Sasaki et al. .
5,192,706   3/1993  Rodder .
5,242,853   9/1993  Sato et al. .
5,498,565   3/1996  Gocho et al. .
5,504,033   4/1996  Bajor et al. .
5,721,173   2/1998  Yano et al. .
5,763,315   6/1998  Benedict et al. .

*Primary Examiner*—George Fourson

[57] ABSTRACT

A method of forming an isolating region of a semiconductor device including the steps of: forming first insulating layers which vary in width on a substrate; forming trenches which vary in width on the substrate by using the first insulating layers as a mask; forming second insulating layers on the trenches and the first insulating layers; exposing the predetermined portions of the first insulating layers by etching the second insulating layers; and wet-etching the first insulating layers and the non-etched portions of the second insulating layers. In the present invention, an isolating region in the narrow trench is formed without voids by regulating the deposition/etching ratio during the formation of an insulating layer in a trench.

26 Claims, 4 Drawing Sheets

METHOD OF FORMING ISOLATING REGION

BACKGROUND OF THE INVENTION

1. Field of the Invention

The present invention relates to a method of forming an isolating region of a semiconductor device and, more particularly to a method of forming the isolating region of a semiconductor device, for forming an isolating layer having no void in a trench, after the formation of the trench, that will provide a device isolating region for 1 Gb, and also provide for planarization of the device.

2. Discussion of Related Art

With the higher integration of a semiconductor device, there are suggested a variety of methods of forming an isolating region of the semiconductor device and a forming region, namely, an active region, in a smaller size. LOCOS (Local Oxidation of Silicon) is a prevailing technique used in forming an isolating region of a semiconductor device due to its simplicity and excellent reproductivity. It is known however that the LOCOS is not suitable for a DRAM of above 64 MB, because of the bird's beaking phenomenon, which is characteristic of an isolating region formed through LOCOS which occurs at the edge of the isolating oxide layer and is extended to the active region, wherein the active region is decreased. Therefore, an advanced LOCOS is employed in the fabrication of a DRAM with 64 MB or 256 MB, so as to reduce the isolating region but increase the active region by preventing the occurrence of the birds' beaking phenomenon or removing the bird's beaking phenomenon itself. But, this advanced LOCOS method still presents some problems of deterioration of the characteristic of the isolating region for a DRAM of above the 1 Gb level which requires a cell region to be 0.2 $\mu m^2$ in area. One of the above problems is the extremely large size of the isolating region and another problem is the leakage of current, which results from the formation of a field oxide layer in the interface with the silicon substrate through the LOCOS and thus a decreased concentration of the silicon substrate. For this reason, there is suggested a new method in forming the isolating region for a DRAM of above the 1 Gb level by using a trench having an easily regulated thickness for the purpose of promoting an isolating effect.

FIGS. 1a–1f are sectional views illustrating a conventional process for forming the isolating region of a semiconductor device.

As shown in FIG. 1a, a pad oxide layer 2 and a polysilicon layer 3 are sequentially formed on a substrate 1, and thereafter divided into patterns which vary in width and space by selective patterning through photolithography and etching. The substrate 1 is then etched to a predetermined depth using the divided polysilicon layer 3 and pad oxide layer 2 as masks so as to form trenches 4 which vary in width.

Referring to FIG. 1b, there is formed a thermal oxide layer 5 along the surface of the trenches 4, and a CVD (Chemical Vapor Deposition) oxide layer 6 is formed on the whole surface of the trench 4 by using an ECR (Electron-Cyclotron-Resonance) apparatus. According to the deposition of the CVD oxide layer 6 with the ECR apparatus, the oxide layer is formed from $SiH_4/N_2O$ gas in an ECR plasma system.

In FIG. 1c, the CVD oxide layer 6 is laterally etched. As a result, the CVD oxide layer 6 formed in the trenches 4 are not etched, but the top edge of the polysilicon layer 3 is exposed, decreasing the width of the CVD oxide layer 6 formed thereon. Further, the CVD oxide layer 6 on the narrow polysilicon layer 3 is completely removed by lateral etching.

In FIG. 1d, after forming a photoresist PR on the whole surface of the polysilicon layer 3 and the CDV oxide layer 6, the CVD oxide layer 6 which was not etched can be selectively exposed by exposure and development. In this process, the top edge of the polysilicon layer 3 formed beneath the CVD oxide layer 6 is partially exposed.

Referring to FIG. 1e, the exposed CVD oxide layer 6 is selectively removed by using the photoresist PR as a mask, which is then also removed.

Finally, in FIG. 1f, the polysilicon layer 3 and the pad oxide layer 2 are removed in sequence as the last step of the conventional process for forming the isolating layer of a semiconductor device.

The problems of the conventional method of forming the isolating layer may be summarized as follows.

First, the process is too complicated. After the CVD oxide layer is formed in the trenches, the process for removing the CVD oxide layer on the polysilicon layer other than the trenches requires lateral etching and patterning, using a photoresist as a mask through photolithography and etching.

Second, if the CVD oxide layer formed in the trench is higher than the upper surface of the polysilicon layer in the deposition of the CVD oxide layer so as to bury the trench, a lateral etching is required for the removal of the CVD oxide layer, and further the CVD oxide layer on the edge of the polysilicon layer is incompletely removed because the edge of the polysilicon layer is masked by the photoresist. The edge of the polysilicon layer is therefore masked by the CVD oxide layer which was incompletely removed, and thus the polysilicon layer beneath the CVD oxide layer may not be etched out during the removal of the polysilicon layer. For this reason, an additional process is required to completely remove the CVD oxide layer and the polysilicon layer beneath the CVD oxide layer, which leads to a reduction in productivity and an increase in production cost.

SUMMARY OF THE INVENTION

The present invention is directed to a method of forming an isolating region of a semiconductor device that substantially obviates one or more of the problems due to limitations and disadvantages of the related art.

Accordingly, an object of the present invention is to provide a method of forming an isolating region in the narrow trench having no voids, by regulating the ratio of deposition/etching during the formation of an insulating layer in a trench.

Another object of the present invention is to provide a method of forming an isolating layer by regulating the ratio of deposition/etching and removing the isolating region forming material produced on the substrate that will be used for an active region by a single lift-off method.

Other objects and further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

To achieve these and other advantages and in accordance with the purpose of the present invention, as embodied and broadly described, the method of forming an isolating region of a semiconductor device comprises the steps of: forming a first insulating layer which varies in width on a substrate; forming trenches which vary in width on the substrate by using the first insulating layers; forming second insulating layers on the trenches and the first insulating layers; exposing predetermined portions of the first insulating layers by etching the second insulating layers; and wet-etching the first insulating layers and the non-etched portions of the second insulating layers.

BRIEF DESCRIPTION OF THE ATTACHED DRAWINGS

The present invention will become more fully understood from the detailed description given hereinbelow and the accompanying drawings which are given by way of illustration only, and thus, are not limitative of the present invention, and wherein.

DETAILED DESCRIPTION OF PREFERRED EMBODIMENT

Reference will now be made in detail to the preferred embodiments of the present invention, examples of which are illustrated in the accompanying drawings.

FIGS. 2a–2f are sectional views illustrating the process for forming an isolating region of a semiconductor device according to a preferred embodiment of the present invention.

Figure 1A:
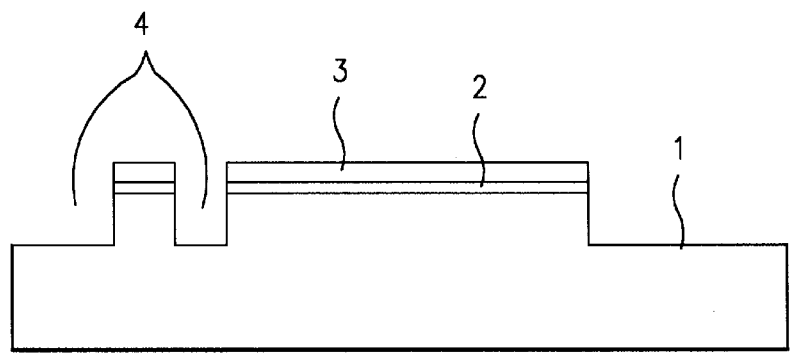
FIGS. 1a–1f are sectional views illustrating the conventional process for forming an isolating region of a semiconductor device.
Figure 1B:
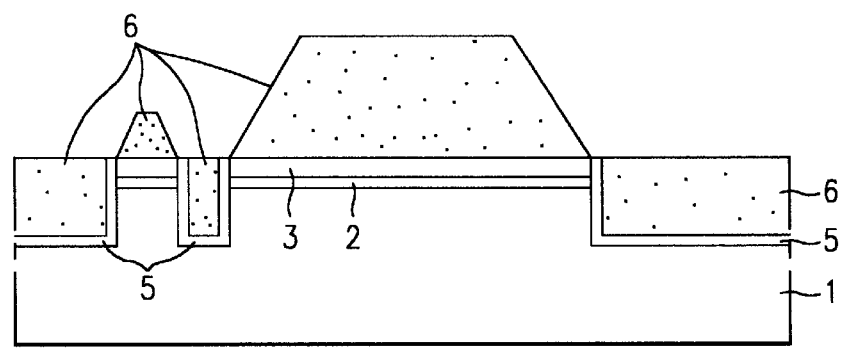
Figure 1C:
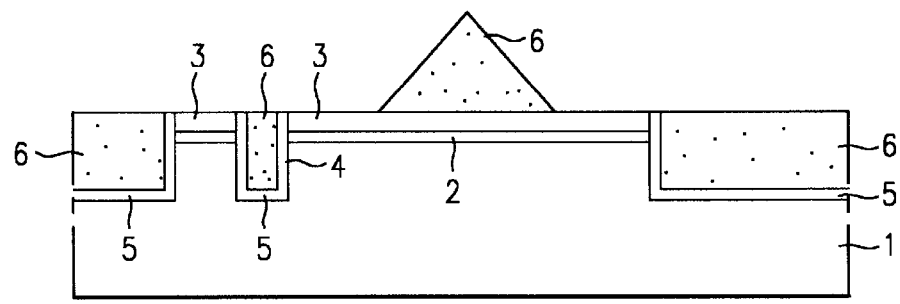
Figure 1D:
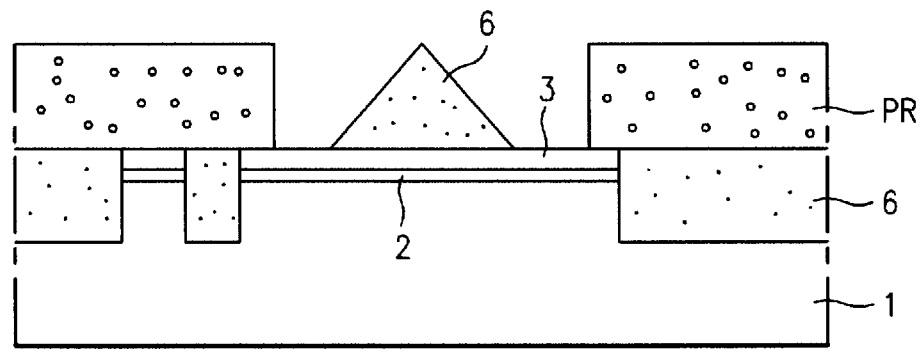
Figure 1E:
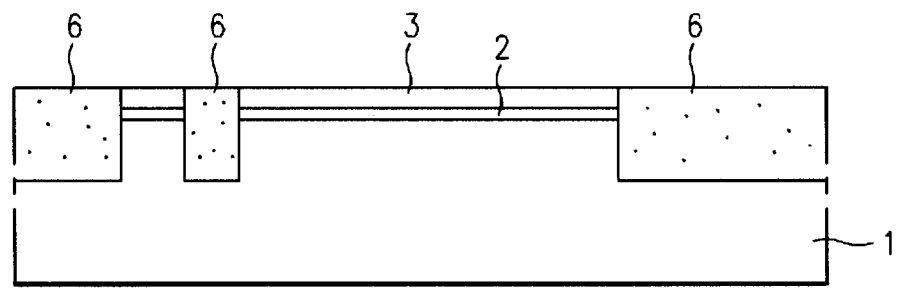
Figure 1F:
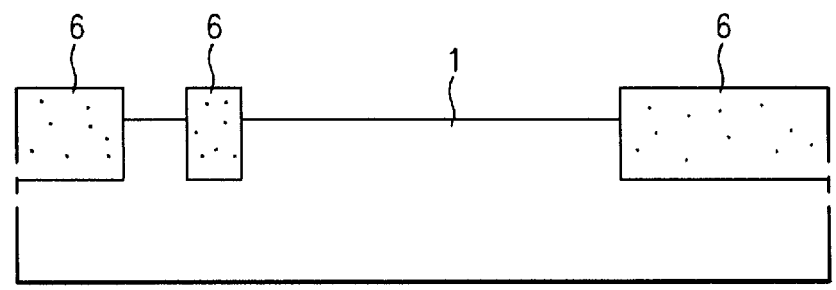
Figure 2A:
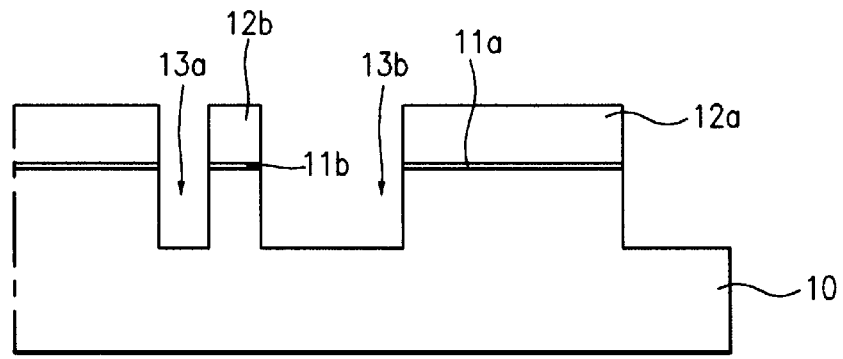
FIGS. 2a–2f are sectional views illustrating the process for forming the isolating region of a semiconductor device according to a preferred embodiment of the present invention.

First, as shown in FIG. 2a, there are formed a first insulating layer and a second insulating layer in sequence on a semiconductor substrate 10, e.g. a silicon substrate. After selectively patterned by photolithography and etching, the first and second insulating layers are divided into a first and second insulating layer patterns 11a, 11b, 12a and 12b which vary in width and occupied space. Then, the substrate 10 is etched to a predetermined depth by using the divided first and second insulating layer patterns 11a, 11b, 12a and 12b as masks so as to form trenches 13a and 13b which vary in width. In this process, the first insulating layer patterns 11a and 11b are formed from an oxide, e.g. silicon dioxide, and the second insulating layer patterns 12a and 12b are formed from a nitride, e.g. silicon nitride. Between the trenches 13a and 13b which vary in width, the narrower trench 13a is less than 0.5 µm in width. The substrate 10 where no trench is formed corresponds to a device forming region, i.e., an active region. Additionally, the oxide layer and the nitride layer can be used interchangeably as the first and second insulating patterns 11a, 11b, 12a and 12b.

Figure 2B:
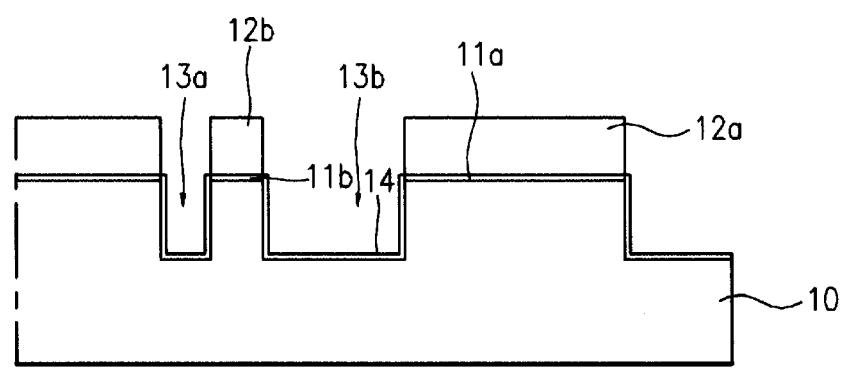

In FIG. 2b, a thermal oxide layer 14, e.g. silicon dioxide, is formed along the surface of the trenches 13a and 13b, and then alternative impurity ions, e.g., boron or arsenic, are implanted into the sides of the trenches 13a and 13b so as to prevent the leakage of current.

Figure 2C:
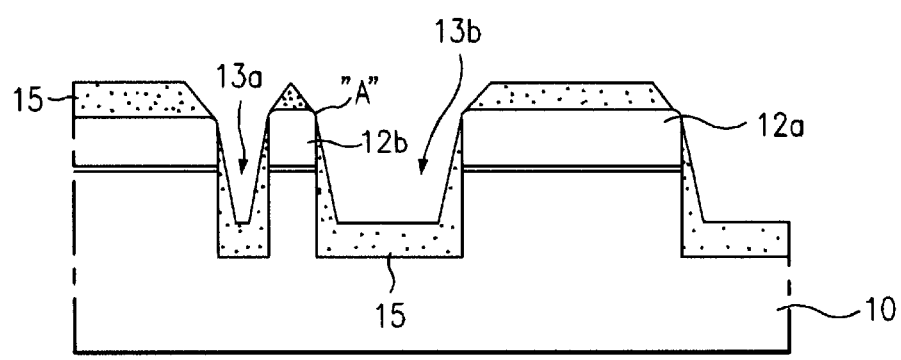
Figure 2D:
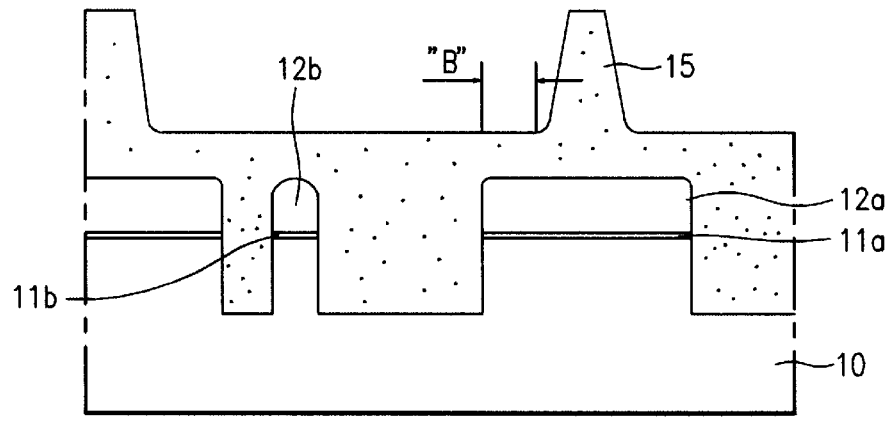

Referring to FIGS. 2c and 2d, there is provided a CVD oxide layer 15, e.g. $SiO_2$, of high density plasma which has substantially different heights formed in the trench regions 13a and 13b, and formed on the second insulating layer patterns 12a and 12b, using an ICP (Inductive Coupling Plasma) device on the entire surface of the trenches 13a and 13b. FIG. 2c is a sectional view showing the process for depositing the CVD oxide layer 15 inside the trenches 13a and 13b and on the second insulating layer patterns 12a and 12b, and FIG. 2d is a sectional view showing the completion of the process for depositing the CVD oxide layer 15. Through the deposition of the CVD oxide layer 15 with the ICP device, using $SiH_4/O_2$ gas as the gas source, the CVD oxide layer 15 in the trenches 13a and 13b is first deposited on the bottom of the trenches 13a and 13b rather than on the sides thereof. The ICP device works under a pressure of less than 10 mtorr with an RF bias power of about 500 to 3000 Watts and a source power of about 2000 to 4000 Watts to generate a plasma source. The ratio of $SiH_4$ to $O_2$ is about 1 to 1.3 so as to provide a larger amount of $O_2$ and the ratio of deposition/sputter etching is about 2.9 to about 8.1. Accordingly, it is possible to form an isolating region in the narrow trench without voids. In particular, as shown in FIG. 2c, by deposition and sputter etching under the above conditions, the CVD oxide layer 15 is deposited with a decreasing width from the top edge "A" of the trenches 13a and 13b to the upper surface of the second insulating layer patterns 12a and 12b, and thus an off-set region "B" having no projected CVD oxide layer 15 is formed on the top edge of the second insulating layer patterns 12a and 12b. The CVD oxide layer 15 formed in the trenches 13a and 13b is higher than the upper layer of the second insulating layer patterns 12a and 12b. In this aspect, the CVD oxide layer 15 can be deposited in the trenches 13a and 13b by varying the conditions such as the RF bias power, the source power or the pressure. Further, such CVD oxide layer 15 can be deposited by a single process or multiple (at least two) processes where the ratio deposition/sputter is changed for each time of the processes.

Figure 2E:
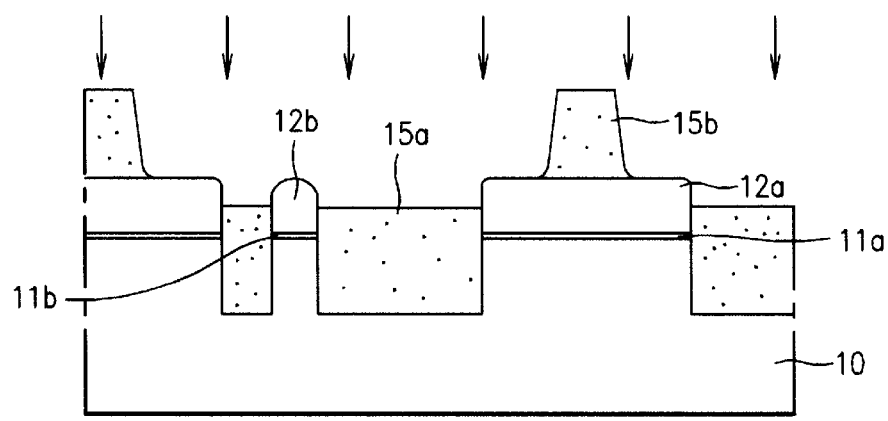

In FIG. 2e, an etch back process using an RIE (Reactive Ion Etch) or a wet etching using a BOE (buffered oxide etchant) or HF is employed to etch the CVD oxide layer 15 so as to partially expose the upper surface and the sides of the second insulating patterns 12a and 12b. The buffered oxide etchant represents the addition of $NH_4F$ to HF to replace the depleted concentration of F used up in the etching process. Then, the CVD oxide layer 15 is divided into the CVD oxide layer 15a formed in the trenches 13a and 13b and the CVD oxide layer 15b formed on the wider second insulating layer pattern 12a. In other words, the CVD oxide layer 15 on the narrower second insulating layer pattern 12b is completely or almost completely removed, and the CVD oxide layer 15b on the wider second insulating layer pattern 12a is not etched in an island shape. If necessary, the CVD oxide layer 15 is used as a mask in implanting a channel stop ion impurity, e.g., B, As or P, into the substrate 10 beneath the trenches 13a and 13b. In the etch back process using RIE, the leakage level can be improved by regulating the heights of the substrate and the CVD oxide layer 15a in the trenches 13a and 13b and thus preventing the recess on the edges of the trenches 13a and 13b.

Figure 2F:
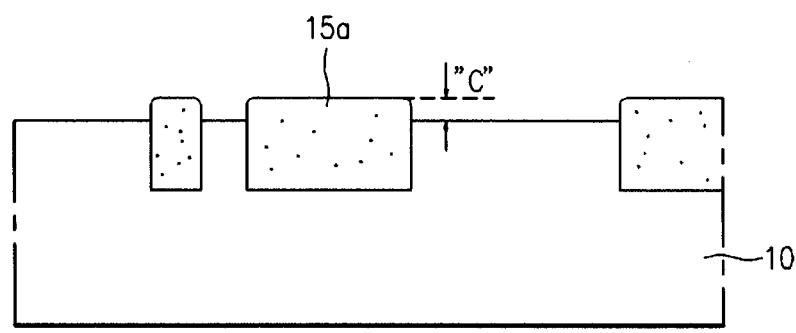

In FIG. 2f, the second insulating layer patterns 12a and 12b are removed with an $H_3PO_4$ solution, whereby the CVD oxide layer 15b on the wider second insulating layer pattern 12a is automatically lifted off and removed. Then, the remaining first insulating layer pattern 11 (11a and 11b) is removed with an HF solution at the end of the process to form the isolating region of a semiconductor device according to the present invention.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming an isolating region of a semiconductor device which comprises:

forming first and second insulating layers on a substrate;

forming trenches through the first and second insulating layers and a portion of the substrate;

forming a third insulating layer on the trenches and the second insulating layer to completely fill the trenches with the third insulating layer;

partially exposing the second insulating layer by etching the third insulating layer; and removing the second insulating layer, whereby the non-etched portions of the third insulating layer is automatically removed.

2. The method of claim 1, wherein the first insulating layer is made of a nitride layer, and the second insulating layer is made of an oxide layer.

3. The method of claim 1, wherein the first insulating layer is made of an oxide layer, and the second insulating layer is made of a nitride layer.

4. The method of claim 1, wherein each of the first and second insulating layers is made of one of a nitride layer and an oxide layer.

5. The method of claim 1, further comprising the step of implanting impurity ions in the trenches after the formation of the trenches.

6. The method of claim 5, wherein the impurity ions are selected from the group consisting of boron and arsenic.

7. The method of claim 1, wherein the third insulating layer is made of a CVD oxide layer.

8. The method of claim 1, wherein the part of the second insulating layer is exposed by etching the third insulating layer through a reactive ion etching.

9. The method of claim 1, wherein in the partially exposing step, a part of the second insulating layer is exposed by a wet etching to the third insulating layer.

10. The method of claim 9, wherein the part of the second insulating layer is exposed by a wet etching with BOE or HF.

11. The method of claim 7, wherein the CVD oxide layer is made from a high density plasma oxide layer.

12. The method of claim 1, wherein the third insulating layer is deposited by means of a plasma system.

13. The method of claim 11, wherein the CVD oxide layer forms the high density plasma oxide layer by using $SiH_4/O_2$ gas.

14. The method of claim 11, wherein the CVD oxide layer forms the high density plasma oxide layer with the RF bias power of about 500 to 3000 Watts and the source power of about 2000 to 4000 Watts under a pressure of less than 10 mtorr.

15. The method of claim 13, wherein $O_2$ is present in an amount greater than the amount of $SiH_4$.

16. The method of claim 13, wherein in the $SiH_4/O_2$ gas, the ratio of $SiH_4$ to $O_2$ is 1 to 1.3.

17. A method of forming an isolating region of a semiconductor device which comprises:

forming a first insulating layer and a second insulating layer in sequence on a semiconductor substrate;

treating the first and second insulating layers to form corresponding insulating layer patterns;

etching the substrate, using the first and second insulating layer patterns as masks, to form trench regions through the first insulating layer, the second insulating layer, and a portion of the substrate;

forming a thermal oxide layer along the surface of the trench regions;

depositing a CVD oxide layer in the trench regions and on the second insulating layer patterns, whereby the trench regions are completely filled with the CVD oxide layer;

etching the CVD oxide layer to partially expose the surface of the second insulating patterns; and removing the second insulating layer patterns to automatically remove the remaining first insulating layer pattern to form said isolating region.

18. The method of claim 17, wherein the first and second insulating layers are treated by photolithography or etching to form said corresponding insulating patterns which vary in width and occupied space.

19. The method of claim 17, wherein the first insulating layer patterns are formed from an oxide and the second insulating layer patterns are formed from a nitride.

20. The method of claim 17, wherein an ion impurity is implanted into the sides of the trenches to prevent the leakage of current.

21. The method of claim 20, wherein an ion impurity is boron or arsenic.

22. The method of claim 17, wherein the CVD oxide layer is deposited using $SiH_4/O_2$ as the gas source.

23. The method of claim 22, wherein the ratio of $SiH_4/O_2$ is 1 to 1.3.

24. The method of claim 17, wherein the CVD oxide layer is deposited in multiple steps where a deposition ratio of a CVD oxide material is changed for each of the multiple steps.

25. The method of claim 17, wherein the CVD oxide layer is etched using BOE or HF.

26. The method of claim 17, wherein the second insulating layer patterns are removed with an $H_3PO_4$ solution and the remaining first insulating layer patterns are removed with an HF solution.

* * * * *